(12) United States Patent
Yamagami et al.

(10) Patent No.: US 7,781,802 B2
(45) Date of Patent: Aug. 24, 2010

(54) SEMICONDUCTOR DEVICE AND MANUFACTURING METHOD THEREOF

(75) Inventors: Shigeharu Yamagami, Yokohama (JP); Masakatsu Hoshi, Yokohama (JP); Yoshio Shimoida, Yokosuka (JP); Tetsuya Hayashi, Yokosuka (JP); Hideaki Tanaka, Yokohama (JP)

(73) Assignee: Nissan Motor Co., Ltd., Yokohama-shi (JP)

( * ) Notice: Subject to any disclaimer, the term of this patent is extended or adjusted under 35 U.S.C. 154(b) by 471 days.

(21) Appl. No.: 11/790,679

(22) Filed: Apr. 26, 2007

(65) Prior Publication Data
US 2007/0252171 A1 Nov. 1, 2007

(30) Foreign Application Priority Data
Apr. 28, 2006 (JP) ............................ 2006-124864

(51) Int. Cl.
*H01L 21/4763* (2006.01)
(52) U.S. Cl. .............................. 257/199; 257/E29.143; 257/E21.046; 438/621
(58) Field of Classification Search ................ 257/597, 257/128, 199, 624, E29.143, E21.062; 438/621
See application file for complete search history.

(56) References Cited

U.S. PATENT DOCUMENTS 6,084,264 A * 7/2000 Darwish ..................... 257/329
6,340,836 B1 * 1/2002 Shikata ....................... 257/544
6,768,138 B1 * 7/2004 Kitada et al. ................. 257/127
2003/0020135 A1 * 1/2003 Kaminski et al. ........... 257/484
2005/0133794 A1 * 6/2005 Hayashi et al. ............... 257/77
2005/0199873 A1 * 9/2005 Tanaka et al. ................. 257/20

FOREIGN PATENT DOCUMENTS

| EP | 0 134 456 A2 | 8/1983 |
|---|---|---|
| EP | 1 641 030 A2 | 3/2006 |
| JP | 2003-318413 A | 11/2003 |
| JP | 2006-86397 A | 3/2006 |

* cited by examiner

*Primary Examiner*—Kiesha R Bryant
*Assistant Examiner*—Mark W Tornow
(74) *Attorney, Agent, or Firm*—Foley & Lardner LLP

(57) ABSTRACT

As semiconductor regions in contact with a first main surface of a semiconductor base composed by forming an N− silicon carbide epitaxial layer on an N+ silicon carbide substrate connected to a cathode electrode, there are provided both of an N+ polycrystalline silicon layer of a same conduction type as a conduction type of the semiconductor base and a P+ polycrystalline silicon layer of a conduction type different from the conduction type of the semiconductor base. Both of the N+ polycrystalline silicon layer and the P+ polycrystalline silicon layer are hetero-joined to the semiconductor base, and are ohmically connected to the anode electrode. Moreover, the N+ polycrystalline silicon layer of the same conduction type as the conduction type of the semiconductor base is formed so as to contact the first main surface of the semiconductor base, and the P+ polycrystalline silicon layer of the conduction type different from the conduction type of the semiconductor base is formed in trenches dug on the first main surface of the semiconductor base.

15 Claims, 10 Drawing Sheets

SEMICONDUCTOR DEVICE AND MANUFACTURING METHOD THEREOF

BACKGROUND OF THE INVENTION

1. Field of the Invention

The present invention relates to a semiconductor device and a manufacturing method thereof.

2. Description of the Related Art

As a conventional technology serving as a background of the present invention, there is a technology described in Japanese Patent Laid-Open Publication No. 2003-318413 "High-Breakdown-Voltage Silicon Carbide Diode and Manufacturing Method Thereof" as Patent Document 1 filed by the applicant of this invention.

In the conventional technology described in Patent Document 1, on a first main surface of a semiconductor base in which an N− silicon carbide epitaxial layer is formed on an N+ silicon carbide substrate, a P+ polycrystalline silicon layer is formed, in which a band gap is different from that of the semiconductor base, and a conduction type is different from that of the semiconductor base. The N− silicon carbide epitaxial layer and the P+ polycrystalline silicon layer form a heterojunction. Here, the P+ polycrystalline silicon layer is connected to an anode electrode, and on a back surface of the N+ silicon carbide substrate, a cathode electrode is formed. Note that symbols + and − represent a high density and a low density, respectively.

The semiconductor device of the conventional technology with the configuration as described above functions as a diode. Specifically, when a potential of the anode electrode is higher than a potential of the cathode electrode, a forward current flows through the diode, and otherwise, a current is inhibited from flowing therethrough.

SUMMARY OF THE INVENTION

In the conventional technology described in Patent Document 1, a forward rise voltage is determined by a work function between the P+ polycrystalline silicon layer and the N− silicon carbide epitaxial layer. Here, for example, in addition to the P+ polycrystalline silicon layer of a second conduction type different from the conduction type of the N− semiconductor base, an N+ polycrystalline silicon layer in which the rise voltage is low is formed on the heterojunction surface in parallel to the P+ polycrystalline silicon layer. In such a case, a mode is established, in which the diodes having two types of rise voltages are parallelly connected. In such a way, the rise voltage of the entire diode can be dropped.

However, in the N+ polycrystalline silicon layer, a reverse breakdown voltage thereof is also low, and accordingly, a reverse breakdown voltage of the entire diode also drops. As described above, the rise voltage and the reverse breakdown voltage are in a proportional relationship to each other, and it has been difficult to drop the rise voltage without lowering the reverse breakdown voltage.

The present invention has been made in consideration for such circumstances. It is an object of the present invention to provide a semiconductor device capable of lowering the rise voltage without lowering the reverse breakdown voltage, and to provide a manufacturing method of the same semiconductor device.

In order to solve the above-described problems, the present invention adopts a configuration, in which a hetero semiconductor region of a same conduction type as a conduction type of a semiconductor base having a second electrode connected thereto is formed on a first main surface of a semiconductor base, a hetero semiconductor region of a conduction type different from the conduction type of the semiconductor base is formed in trenches dug on the first main surface of the semiconductor base, and both of the hetero semiconductor regions are parallelly connected to a first electrode.

In accordance with the semiconductor device and the manufacturing method thereof according to the present invention, the hetero semiconductor region of a first conduction type that is the same as the conduction type of the semiconductor base is formed on the first main surface of the semiconductor base, the hetero semiconductor region of the second conduction type that is different from the conduction type of the semiconductor base is formed in the trenches dug on the first main surface of the semiconductor base, and both of the hetero semiconductor regions are parallelly connected to the first electrode. In such a way, the rise voltage can be lowered by the hetero semiconductor region of the first conduction type, which is parallelly connected to the first electrode, and the lowering of the breakdown voltage can be suppressed by the hetero semiconductor region of the second conduction type, which is formed in the trenches on the first main surface of the semiconductor base.

BRIEF DESCRIPTION OF THE DRAWINGS

Exemplary embodiments of the invention will become more fully apparent from the following description and appended claims, taken in conjunction with the accompanying drawings. Understanding that these drawings depict only exemplary embodiments and are, therefore, not to be considered limiting of the invention's scope, the exemplary embodiments of the invention will be described with additional specificity and detail through use of the accompanying drawings in which:

DETAILED DESCRIPTION OF THE PREFERRED EMBODIMENTS

Figure 1:
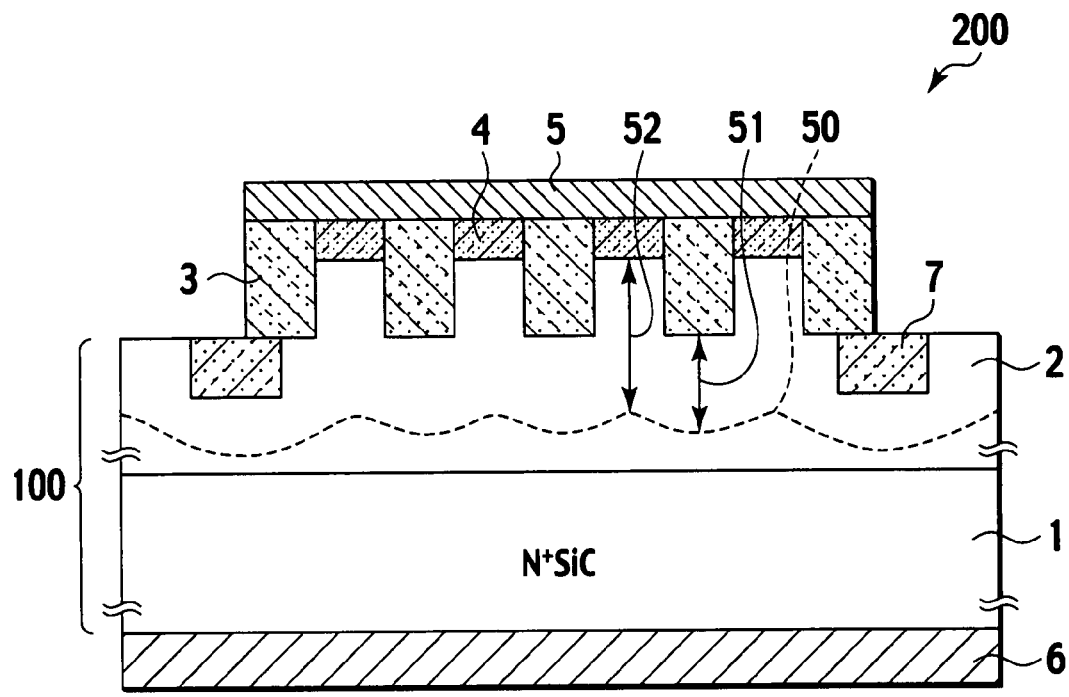
FIG. 1 is a cross-sectional view showing an element portion cross-sectional structure in a first embodiment of a semiconductor device according to the present invention.

A description will be made below in detail of an example of best embodiments of a semiconductor device and a manufacturing method thereof according to the present invention while referring to the drawings.

First Embodiment

A description will be made of a first embodiment of the semiconductor device and the manufacturing method thereof according to the present invention based on FIG. 1 to FIG. 11. In this embodiment, a description will be made of, as an example, a semiconductor device, in which silicon carbide (SiC) is used as a substrate material, and polycrystalline silicon is used as a material of a hetero semiconductor. Note that, in the present invention, the substrate material is not limited to silicon carbide, and may be gallium nitride or diamond.

Moreover, the material of the hetero semiconductor is not limited to polycrystalline silicon, either, as long as the material forms a hetero semiconductor region made of a semiconductor material having a different band gap from that of a semiconductor base formed of an epitaxial layer stacked on a substrate. The hetero semiconductor may be made of monocrystalline silicon germanium, polycrystalline silicon germanium, amorphous silicon germanium, and the like, and moreover, may be made of monocrystalline germanium, polycrystalline germanium, amorphous germanium, polycrystalline gallium arsenide, amorphous gallium arsenide, and the like.

FIG. 1 is a cross-sectional view showing an element cross-sectional structure in the first embodiment of the semiconductor device according to the present invention.

As shown in the semiconductor device 200 of FIG. 1, an N− silicon carbide semiconductor is epitaxially grown on an N+ silicon carbide substrate 1, whereby an N− silicon carbide epitaxial layer 2 is stacked thereon, and a silicon carbide semiconductor base 100 is formed. On a first main surface of the N− silicon carbide epitaxial layer 2, which is opposite with the N+ silicon carbide substrate 1 side, one or a plurality of trenches are dug at predetermined positions. On portions of the first main surface, where the trenches are present, a P+ polycrystalline silicon layer 3 is formed as a hetero semiconductor region of a second conduction type different from a conduction type (a first conduction type) of the N+ semiconductor base 100 in a state of being filled into insides of the trenches.

Moreover, on the main surface of the N− silicon carbide epitaxial layer 2, where the trenches are not present, an N+ polycrystalline silicon layer 4 is formed as a hetero semiconductor region of the first conduction type that is the same as the conduction type of the semiconductor base 100. Here, both of the polycrystalline silicon layers as the P+ polycrystalline silicon layer 3 and the N+ polycrystalline silicon layer 4 and the N− silicon carbide epitaxial layer 2 that composes the semiconductor substrate 100 are formed so as to have band gaps different from one another, and form heterojunction interfaces. Here, as described above, symbols + and − represent that densities of introduced impurities are high and low.

Moreover, in a predetermined region in the N− silicon carbide epitaxial layer 2, P field limiting regions 7 are formed, which limit an electric field applied from a cathode electrode 6 to junction portions between the silicon carbide semiconductor base 100 and both of the polycrystalline silicon layers as the P+ polycrystalline silicon layer 3 and the N+ polycrystalline silicon layer 4. Moreover, on the P+ polycrystalline silicon layer 3 and the N+ polycrystalline silicon layer 4, an anode electrode 5 ohmically connected to both of the polycrystalline silicon layers concerned is formed as a first electrode. Meanwhile, on a back surface of the N+ silicon carbide substrate 1, the cathode electrode 6 is formed as a second electrode.

According to this embodiment, the P+ polycrystalline silicon layer 3 in which a built-in voltage with the N− silicon carbide epitaxial layer 2 is large and a reverse breakdown voltage is high is formed in insides of the trenches of the N− silicon carbide epitaxial layer 2. Specifically, the P+ polycrystalline silicon layer 3 of the second conduction type different from the conduction type (the first conduction type) of the N silicon carbide semiconductor substrate 100 is formed on the first main surface of the N silicon carbide semiconductor base 100 so that bottom surfaces of the P+ polycrystalline silicon layer 3 can be located in the insides of the trenches at positions deeper than bottom surfaces of the N+ polycrystalline silicon layer 4 of the same conduction type as the conduction type of the N silicon carbide semiconductor base 100. In such a way, a depletion layer in the N− silicon carbide epitaxial layer 2 in the case where a reverse voltage is applied to the semiconductor device 200 can be expanded more deeply.

As a result, a distance 52 from a depletion layer end 50 to the N+ polycrystalline silicon layer 4 becomes longer than a distance 51 from the depletion layer end 50 to the P+ polycrystalline silicon layer 3, and the electric field applied to the heterojunction interfaces between the N+ polycrystalline silicon layer 4 and the N– silicon carbide epitaxial layer 2 is lowered, thus making it possible to limit the electric field. In such a way, with regard to the breakdown voltage when the reverse voltage is applied, a substantially equivalent value to that of the case of only the P+ polycrystalline silicon layer 3 can be obtained.

Moreover, if the impurity densities of the P+ polycrystalline silicon layer 3 and the N+ polycrystalline silicon layer 4 are set sufficiently higher in advance than the impurity density of the silicon carbide epitaxial layer 2, when the reverse voltage is applied, the depletion layer can be prevented from extending to the polycrystalline silicon layer side including the P+ polycrystalline silicon layer 3 and the N+ polycrystalline silicon layer 4. In such a way, in the polycrystalline silicon layer in which field intensity causing an electrical breakdown is lower in comparison with silicon carbide, it is made possible to prevent the breakdown from occurring, whereby the reverse breakdown voltage can be enhanced.

Meanwhile, when a forward voltage is applied, a rise voltage of the entire heterojunction diode in this embodiment can be lowered since the N+ polycrystalline silicon layer 4 of which rise voltage is low is formed. Moreover, the P+ polycrystalline silicon layer 3 is also ohmically connected to the anode electrode 5, and accordingly, functions as a current path when the forward voltage is applied. Here, the heterojunction surfaces of the P+ polycrystalline silicon layer 3 are brought into contact with the semiconductor base 100 not only by the bottom portions of the trenches but also by at least a part of side surface portions of the trenches, and both of the bottom portions and side surface portions of the trenches become current paths. Accordingly, a lower ON resistance can be obtained than in the case where the heterojunction surfaces are formed in a planar manner.

Moreover, the P+ polycrystalline silicon layer 3 and the N+ polycrystalline silicon layer 4 are brought into contact with each other, whereby the heterojunction interfaces between both of the polycrystalline silicon layers concerned and the N– silicon carbide epitaxial layer 2 entirely become active regions. Hence, a current flow is uniformed in the heterojunction interfaces, and a highly reliable semiconductor device can be obtained.

Note that, in this embodiment, the description has been made of the example where the cathode electrode 6 is formed on the back surface of the silicon carbide semiconductor base 100; however, the semiconductor device in this embodiment may be a so-called lateral diode in which the cathode electrode 6 is formed on a front surface of the silicon carbide semiconductor base 100.

In this embodiment, the illustration has been made of the case where the number of trenches filled with the P+ polycrystalline silicon layer 3 is five including those in a peripheral portion as shown in FIG. 1. However, the number of trenches may be increased and reduced to a desired arbitrary number that is one or a plurality in response to an area of the diode.

Next, a description will be made of a manufacturing method of the semiconductor device 200 of FIG. 1 in this embodiment, that is, the heterojunction diode by using FIG. 2 to FIG. 11. Here, FIG. 2 to FIG. 11 are element portion cross-sectional structure views explaining a first step to tenth step of the manufacturing method of the semiconductor device in the first embodiment of the present invention, respectively.

Figure 2:
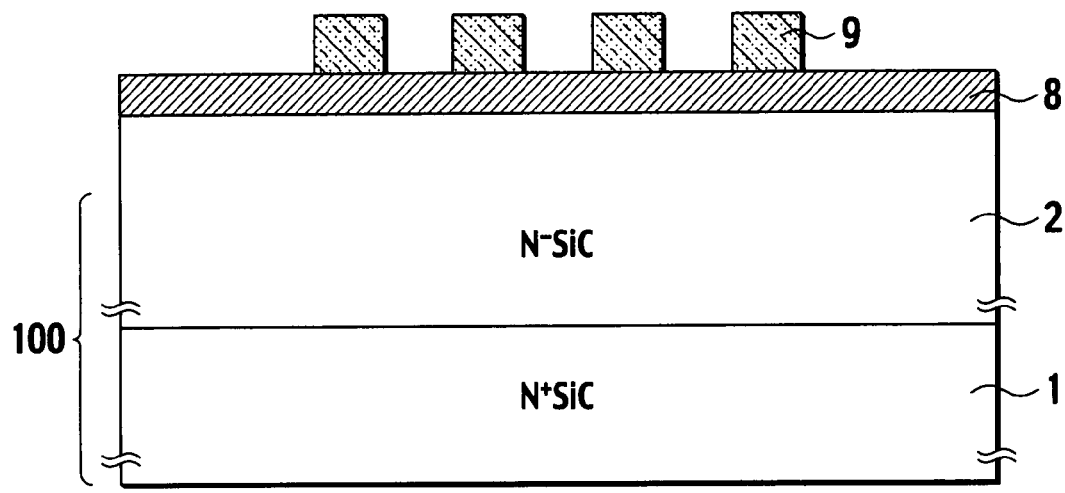
FIG. 2 is an element portion cross-sectional structure view explaining a first step of a manufacturing method of the semiconductor device in the first embodiment of the present invention.

First, in the first step (a semiconductor base forming step) of FIG. 2, the semiconductor base 100 is formed, for example, in which the N– silicon carbide epitaxial layer 2 is stacked on the N+ silicon carbide substrate 1. On the N– silicon carbide epitaxial layer 2, predetermined mask film 8 and resist 9 are stacked, and then the resist 9 is pattered into a pattern for forming one or a plurality of predetermined trenches by using photolithography and the like. Note that, for example, a silicon nitride film and the like are used as the mask film 8.

Figure 3:
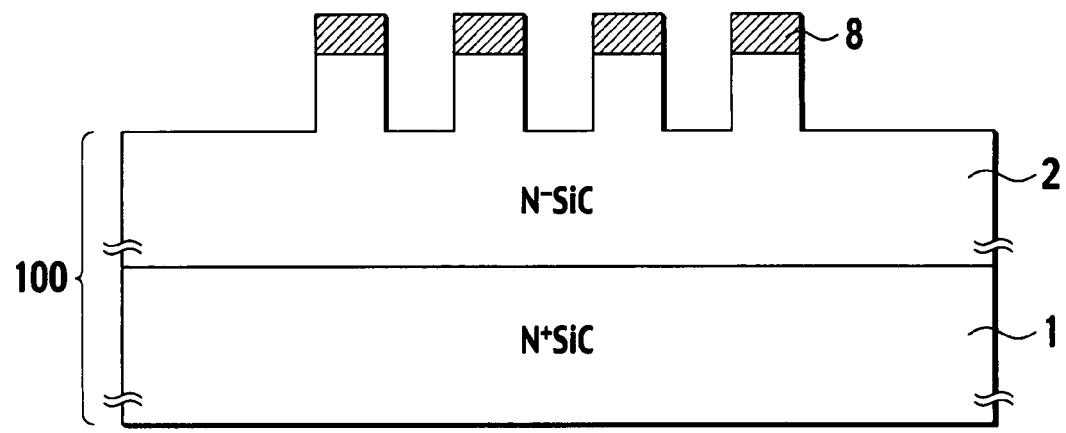
FIG. 3 is an element portion cross-sectional structure view explaining a second step of the manufacturing method of the semiconductor device in the first embodiment of the present invention.

Next, in the second step (a trench forming step) of FIG. 3, by using the resist 9 as a mask, the mask film 8 and the N– silicon carbide epitaxial layer 2 are dry-etched so as to dig the one or plurality of trenches on the first main surface of the N– silicon carbide epitaxial layer 2. After such dry etching, the resist 9 is removed.

Figure 4:
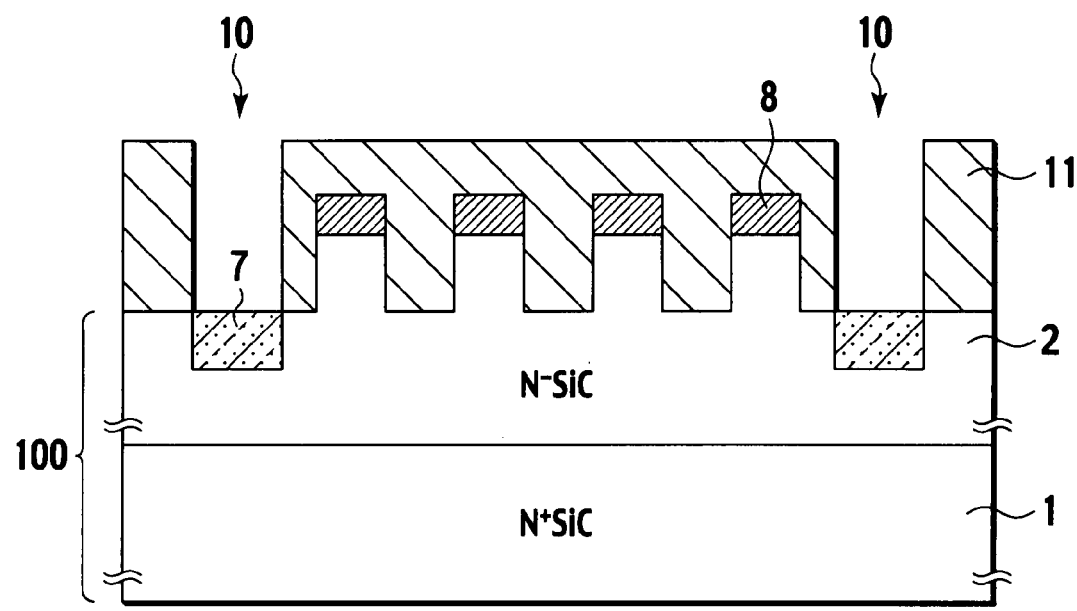
FIG. 4 is an element portion cross-sectional structure view explaining a third step of the manufacturing method of the semiconductor device in the first embodiment of the present invention.

In the next third step (a first-half step of a field limiting region forming step) of FIG. 4, the field limiting regions 7 are formed in regions in the N– silicon carbide epitaxial layer 2, which become the junction surfaces in contact with the peripheral portion of the P+ polycrystalline silicon layer 3 to be formed later, that is, regions of the trench bottom surface portions formed on the peripheral portion of the N– silicon carbide epitaxial layer 2. Specifically, an ion implantation mask 11 is formed on the mask film 8 and the trenches of the N– silicon carbide epitaxial layer 2, which are other than regions where the field limiting regions 7 are to be formed, and P impurity ions 10 of aluminum, boron, and the like are then implanted into the regions which are not covered with the ion implantation mask 11, whereby the P field limiting regions 7 are formed.

When the ions are implanted at room temperature, the resist can be used as the ion implantation mask 11. Meanwhile, when the ions are implanted while heating the substrate to approximately 600° C. in order to prevent surface roughening of the substrate, not the resist but a mask of a silicon oxide film and the like can be used. In this case, it is necessary that selective etching with the previously formed mask film 8 be enabled for the ion implantation mask 11.

Figure 5:
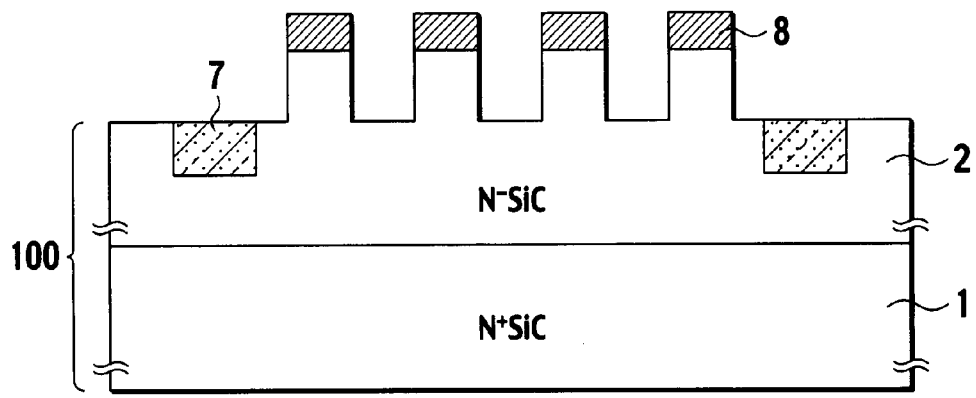
FIG. 5 is an element portion cross-sectional structure view explaining a fourth step of the manufacturing method of the semiconductor device in the first embodiment of the present invention.

In the next fourth step (a second-half step of the field limiting region forming step) of FIG. 5, after the ion implantation mask 11 is removed, annealing is performed at a high temperature of approximately 1700° C., whereby the introduced impurities are activated. Note that the field limiting regions 7 are not limited only to the case of using the semiconductor of the conduction type different from that of the semiconductor base 100 as described above, and for the field limiting regions 7, high resistors and insulators may be formed. Moreover, depending on the case, a structure may be adopted, in which the field limiting regions 7 are not formed. In such a case, the above-described steps of FIG. 4 and FIG. 5 are omitted.

Figure 6:
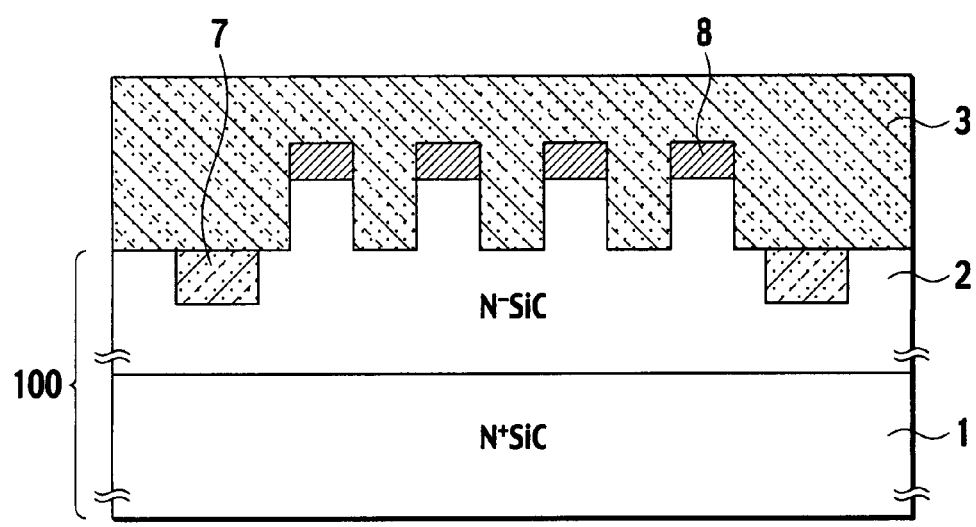
FIG. 6 is an element portion cross-sectional structure view explaining a fifth step of the manufacturing method of the semiconductor device in the first embodiment of the present invention.

Thereafter, in the fifth step (a first-half step of a second hetero semiconductor region forming step) of FIG. 6, the P+ polycrystalline silicon layer 3 is deposited on the entire surfaces of the mask film 8 and the N– silicon carbide epitaxial layer 2.

Figure 7:
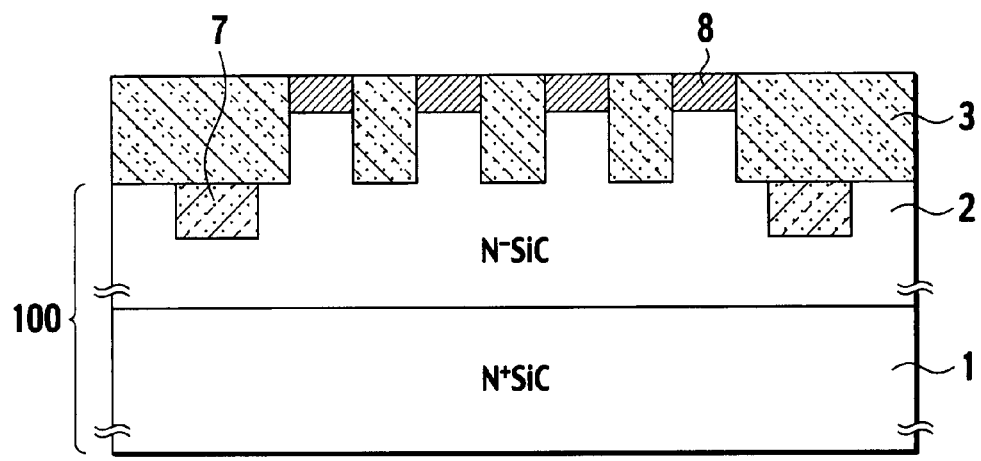
FIG. 7 is an element portion cross-sectional structure view explaining a sixth step of the manufacturing method of the semiconductor device in the first embodiment of the present invention.

In the next sixth step (a second-half step of the second hetero semiconductor region forming step) of FIG. 7, the P+ polycrystalline silicon layer 3 is etched until the mask film 8 is exposed, and is formed as a second hetero semiconductor region. As a method of the etching, etch back by dry etching can be used, and a flattening technique by chemical mechanical polishing (CMP) and the like can be used. As a result, the P+ polycrystalline silicon layer 3 of the second hetero semiconductor region, in which the band gap is different from that of the N– silicon carbide epitaxial layer 2 of the semiconductor base, and the conduction type is different from that of the N− silicon carbide epitaxial layer 2, is formed in a state where not only bottom portions thereof are brought into contact with the bottom surface portions of the trenches in the N− silicon carbide epitaxial layer 2 but also side surface portions thereof are brought into contact with at least a partial region of the side surface portions of the trenches in the N− silicon carbide epitaxial layer 2.

Figure 8:
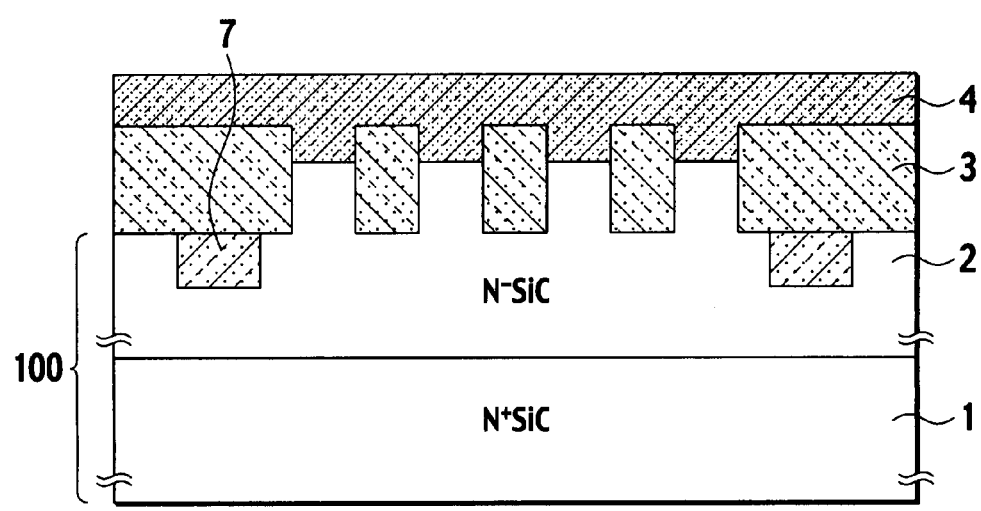
FIG. 8 is an element portion cross-sectional structure view explaining a seventh step of the manufacturing method of the semiconductor device in the first embodiment of the present invention.

In the next seventh step (a first-half step of a first hetero semiconductor region forming step) of FIG. 8, after the mask film 8 is removed to expose the first main surface of the N− silicon carbide epitaxial layer 2, the N+ polycrystalline silicon layer 4 is deposited on the exposed first main surface of the N− silicon carbide epitaxial layer 2 and on the P+ polycrystalline silicon layer 3.

Figure 9:
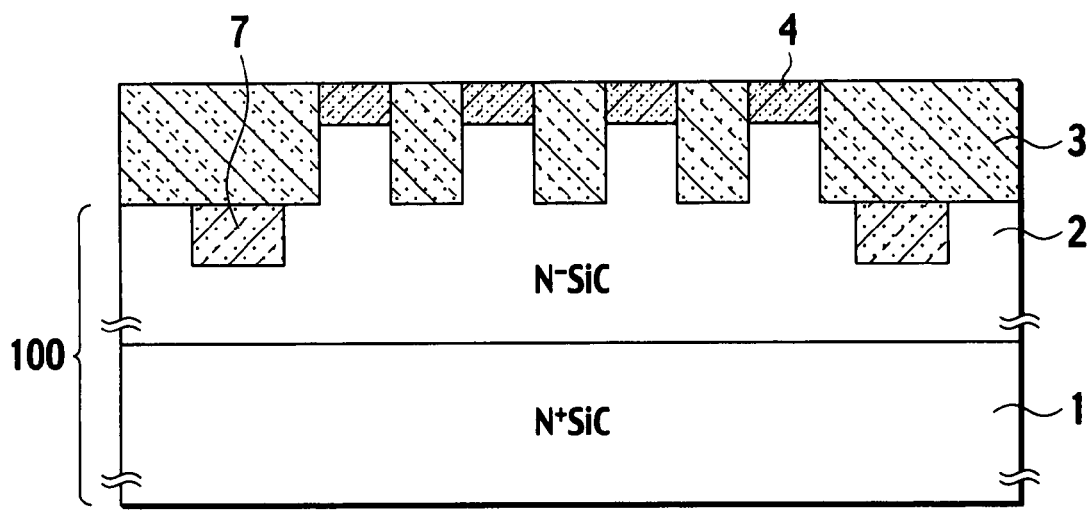
FIG. 9 is an element portion cross-sectional structure view explaining an eighth step of the manufacturing method of the semiconductor device in the first embodiment of the present invention.

In the next eighth step (a second-half step of the first hetero semiconductor region forming step) of FIG. 9, the N+ polycrystalline silicon layer 4 is etched until the P+ polycrystalline silicon layer 3 is exposed, and is formed as a first hetero semiconductor region. As a method of the etching, the etch back by the dry etching can be used, and the flattening technique by the CMP and the like can be used. Here, the N+ polycrystalline silicon layer 4 that becomes the first hetero semiconductor region of the same conduction type as that of the N− silicon carbide epitaxial layer 2 of the semiconductor base, in which the band gap is though different from that of the N− silicon carbide epitaxial layer 2, may be formed in a state of covering a part of the trenches dug on the first main surface of the N− silicon carbide epitaxial layer 2 as long as at least a partial region of the P+ polycrystalline silicon layer 3 is exposed.

Figure 10:
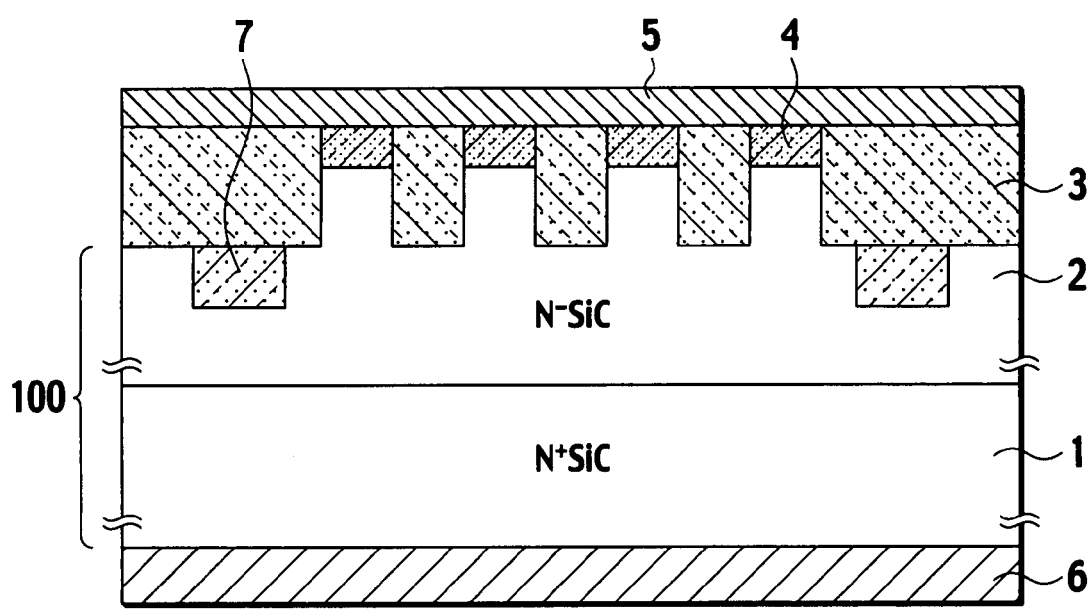
FIG. 10 is an element portion cross-sectional structure view explaining a ninth step of the manufacturing method of the semiconductor device in the first embodiment of the present invention.

Moreover, in the next ninth step (a first-half step of a first electrode forming step, a second electrode forming step) of FIG. 10, the cathode electrode 6 is formed as the second electrode on the back surface of the silicon carbide semiconductor base 100. Here, rapid thermal anneal (RTA) of approximately 1000° C. is implemented according to needs so that the silicon carbide semiconductor base 100 and the cathode electrode 6 can be brought into ohmic contact with each other.

Next, the anode electrode 5 is deposited on both of the polycrystalline silicon layers as the P+ polycrystalline silicon layer 3 and the N+ polycrystalline silicon layer 4. Note that, as an electrode material of the anode electrode 5 and the cathode electrode 6, titanium, aluminum and the like are used. In this case, the impurities are doped at a high density into both of the polycrystalline silicon layers as the P+ polycrystalline silicon layer 3 and the N+ polycrystalline silicon layer 4, and accordingly, the polycrystalline silicon layers and the anode electrode 5 are brought into ohmic contact with each other.

Figure 11:
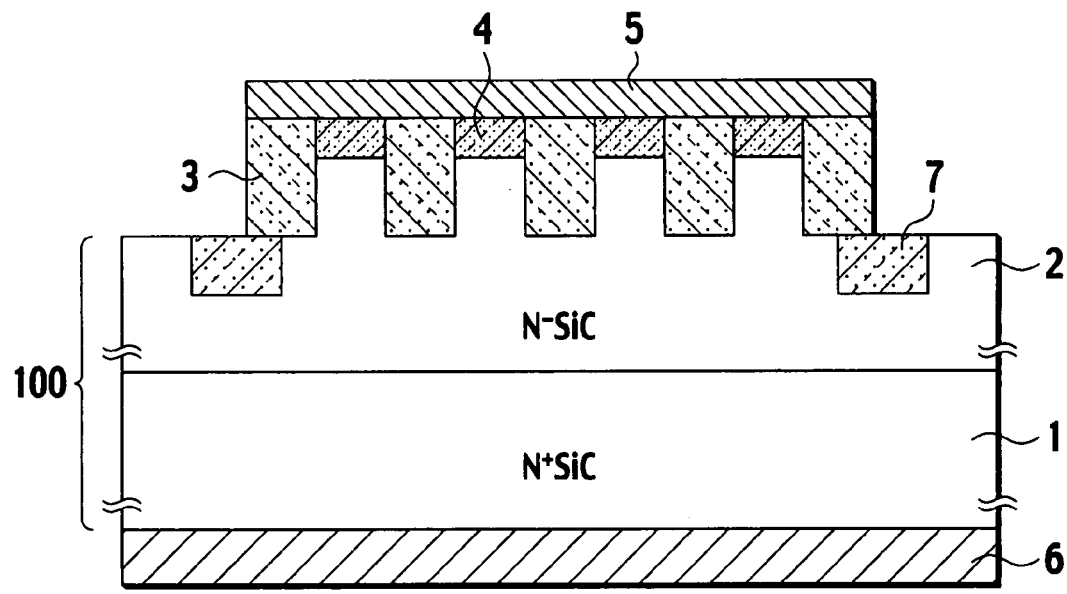
FIG. 11 is an element portion cross-sectional structure view explaining a tenth step of the manufacturing method of the semiconductor device in the first embodiment of the present invention.

In the final tenth step (a second-half step of the first electrode forming step) of FIG. 11, a resist pattern is formed on the anode electrode 5 by the photolithography. Moreover, by using the formed resist as a mask, the anode electrode 5 and the polycrystalline silicon layers as the P+ polycrystalline silicon layer 3 and the N+ polycrystalline silicon layer 4 are patterned by the dry etching, whereby the semiconductor device 200 as shown in FIG. 1 is finally manufactured.

As described above in detail, in accordance with the semiconductor device 200 and the manufacturing method thereof according to this embodiment, for example, the N+ hetero semiconductor region 4 of the first conduction type that is the same as the conduction type of the semiconductor base 100 is formed on the first main surface of the semiconductor base 100, and for example, the P+ hetero semiconductor region 3 of the second conduction type that is different from the conduction type of the semiconductor base 100 is formed in the trenches formed on the first main surface of the semiconductor base 100. In such a way, the rise voltage can be lowered, and the lowering of the breakdown voltage can be suppressed. The reasons of these effects are as follows.

The trenches are dug on the first main surface of the N− silicon carbide epitaxial layer 2 that forms the semiconductor base 100. Then, the insides of the trenches are filled with, for example, the P+ polycrystalline silicon layer 3 as the hetero semiconductor region of the conduction type different from that of the semiconductor base 100. Meanwhile, for example, the N+ polycrystalline silicon layer 4 is formed as the hetero semiconductor region of the same conduction type as that of the semiconductor base 100 on the portions of the N− silicon carbide epitaxial layer 2, which do not have the trenches. As described above, the P+ polycrystalline silicon layer 3 is formed in the insides of the trenches, which are deeper than the position of the N+ polycrystalline silicon layer 4, thus making it possible to extend the depletion layer more deeply into the N− silicon carbide epitaxial layer 2 when the reverse voltage is applied. Hence, the electric field applied to the heterojunction interfaces between the N+ polycrystalline silicon layer 4 and the N− silicon carbide epitaxial layer 2, in which the breakdown voltages are low, is lowered, and the lowering of the breakdown voltage in the portions concerned can be suppressed.

Moreover, the configuration is adopted, in which the anode electrode 5 is parallelly connected to both of the P+ polycrystalline silicon layer 3 and the N+ polycrystalline silicon layer 4. Accordingly, when the forward voltage is applied, the rise voltage of the entire heterojunction diode can be lowered owing to the presence of the N+ polycrystalline silicon layer 4 in which the rise voltage is low. Moreover, also with regard to the heterojunction interfaces between the P+ polycrystalline silicon layer 3 and the N− silicon carbide epitaxial layer 2 in the insides of the trenches, not only the bottom portions of the trenches but also at least a partial region of the side surface portions of the trenches can be set into the ON state. Accordingly, an effective area is increased, thus making it possible to reduce the ON resistance.

Second Embodiment

Figure 12:
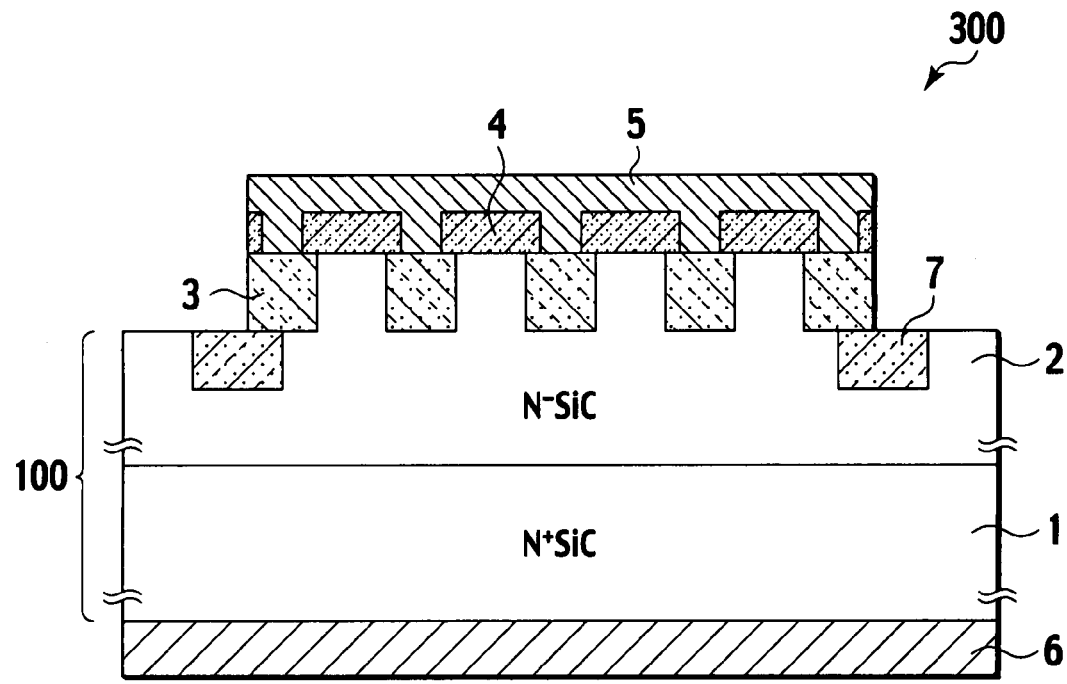
FIG. 12 is a cross-sectional view showing an element portion cross-sectional structure in a second embodiment of the semiconductor device according to the present invention.

Next, a description will be made of a second embodiment of the semiconductor device and the manufacturing method thereof according to the present invention based on FIG. 12. FIG. 12 is a cross-sectional view showing an element portion cross-sectional structure in the second embodiment of the semiconductor device according to the present invention. In a similar way to the first embodiment, the semiconductor device 300 in this embodiment, which is shown in FIG. 12, is a device, in which silicon carbide (SiC) is used as a substrate material, and polycrystalline silicon is used as a material of a hetero semiconductor. However, as shown in FIG. 12, the semiconductor device 300 is different from the semiconductor device 200 of the first embodiment, which is shown in FIG. 1, in the connection method of the P+ polycrystalline silicon layer 3 and the anode electrode 5.

Specifically, the semiconductor device 300 of FIG. 12 is configured in the following manner. Specifically, contact holes to the P+ polycrystalline silicon layer 3 are formed in the N+ polycrystalline silicon layer 4, whereby the P+ polycrystalline silicon layer 3 and the anode electrode 5 are connected to each other through the contact holes.

In this embodiment, the steps from the first step to the fourth step (the second-half step of the field limiting region forming step) of FIG. 5 in the first embodiment are first performed. Thereafter, in place of performing the fifth and six steps (the second hetero semiconductor region forming step)

of FIG. 6 and FIG. 7, after the mask film 8 is removed, the P+ polycrystalline silicon layer 3 is formed so as to be filled into the insides of the trenches dug on the N− silicon carbide epitaxial layer 2. Thereafter, in place of the seventh and eighth steps (the first hetero semiconductor region forming step) of FIG. 8 and FIG. 9 in the first embodiment, the N+ polycrystalline silicon layer 4 is entirely stacked on the P+ polycrystalline silicon layer 3 and the N− silicon carbide epitaxial layer 2, and thereafter, the contact holes to the P+ polycrystalline silicon layer 3 are formed in the N+ polycrystal line silicon layer 4 by the photolithography and the dry etching.

Specifically, in this embodiment, for example, the N+ polycrystalline silicon layer 4 as the first hetero semiconductor region of the first conduction type is formed so as to entirely cover the N− silicon carbide epitaxial layer 2 and the P+ polycrystalline silicon layer 3, including the positions where the trenches dug on the N− silicon carbide epitaxial layer 2 are present without being limited only to the positions where the trenches are not present. Therefore, the contact holes for connecting the anode electrode 5 and the P+ polycrystalline silicon layer 3 to each other are formed. Here, the P+ polycrystalline silicon layer 3 is the second hetero semiconductor region of the second conduction type in a state of being buried in the inside of the N+ polycrystalline silicon layer 4 without being exposed to the surface of the semiconductor device 300.

The next electrode forming step is substantially similar to the ninth and tenth steps (the first electrode forming step, the second electrode forming step) of FIG. 10 and FIG. 11 in the first embodiment. In the first embodiment, the anode electrode 5 is deposited so as to contact both of the P+ polycrystalline silicon layer 3 and the N+ polycrystalline silicon layer 4, and the ohmic contact is thereby made therebetween. As opposed to this, in this embodiment, the anode electrode 5 is deposited to contact the N+ polycrystalline silicon layer 4, and the ohmic contact is made therebetween. Meanwhile, the anode electrode 5 and the P+ polycrystalline silicon layer 3 are brought into ohmic contact with each other through the contact holes.

By adopting the configuration of the semiconductor device 300 as shown in FIG. 12, such etch back for the entire N+ polycrystalline silicon layer 4, which is as performed in the eighth step of FIG. 9 of the first embodiment, can be avoided, and an occurrence of such malfunction that the N+ polycrystalline silicon layer 4 disappears owing to over etching can be eliminated.

Third Embodiment

Figure 13:
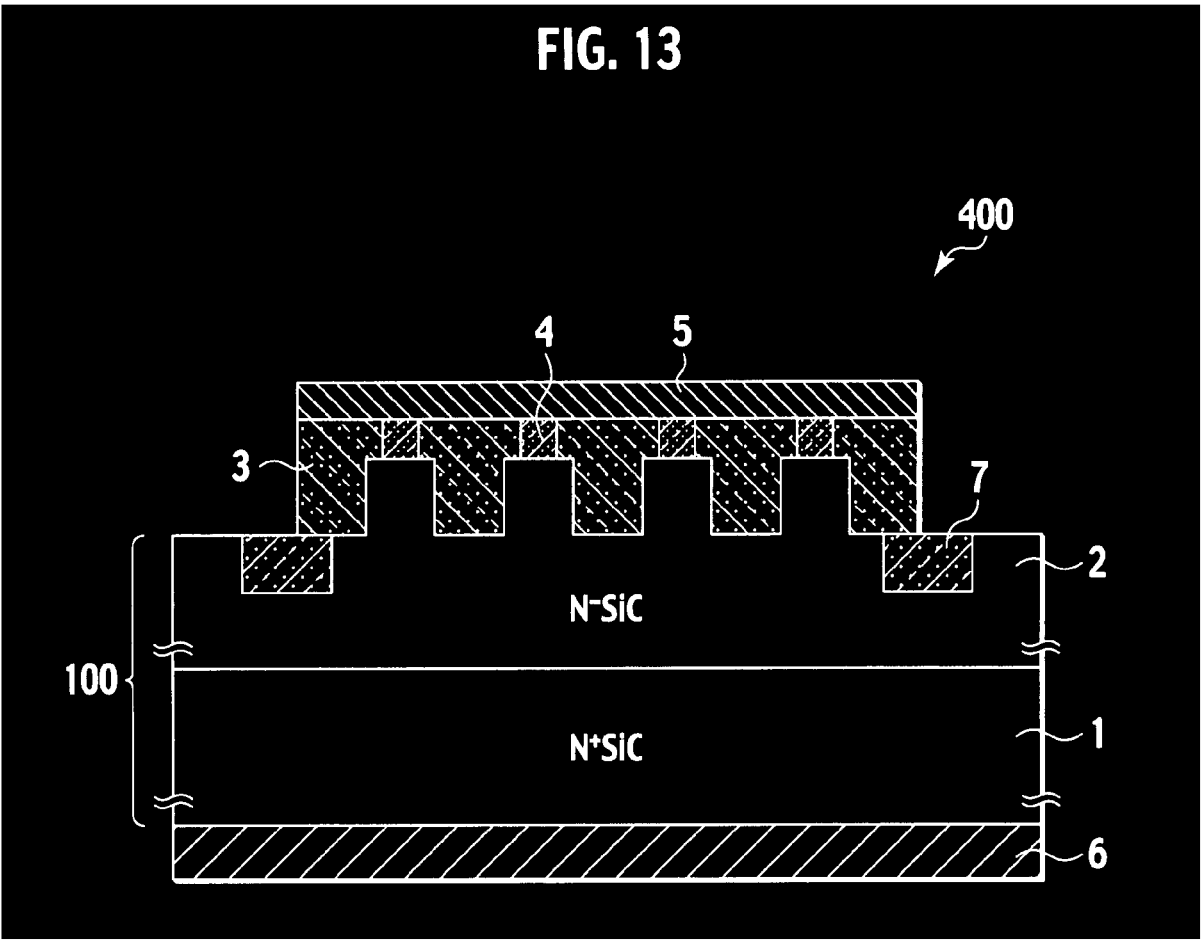
FIG. 13 is a cross-sectional view showing an element portion cross-sectional structure in a third embodiment of the semiconductor device according to the present invention.

Next, a description will be made of a third embodiment of the semiconductor device and the manufacturing method thereof according to the present invention based on FIG. 13. FIG. 13 is a cross-sectional view showing an element portion cross-sectional view in the third embodiment of the semiconductor device according to the present invention. In a similar way to the first embodiment and the second embodiment, the semiconductor device 400 in this embodiment, which is shown in FIG. 13, is a device, in which silicon carbide (SiC) is used as a substrate material, and polycrystalline silicon is used as a material of a hetero semiconductor. However, as shown in FIG. 13, the semiconductor device 400 is different from the semiconductor devices of the first embodiment and the second embodiment in that the P+ polycrystalline silicon layer 3 and the N+ polycrystalline silicon layer 4 are formed by separately implanting the ions into the semiconductor region.

Specifically, in place of the second hetero semiconductor region forming step and the first hetero semiconductor region forming step in the first embodiment and the second embodiment, a manufacturing method of manufacturing the semiconductor device 400 of FIG. 13 includes: a hetero semiconductor region forming step of forming a semiconductor region different in band gap from the semiconductor base 100 entirely on the first main surface of the semiconductor base 100; and an ion implanting step of implanting ions of, for example, P+ impurities different in conduction type from the semiconductor base into a region among the entirely formed semiconductor region, where the trenches are dug on the first main surface of the semiconductor base 100, thereby forming the P+ polycrystalline silicon layer 3 that becomes the second hetero semiconductor region, and of implanting ions of, for example, N+ impurities same in conduction type as the semiconductor base into a region where the trenches are not dug on the first main surface, thereby forming the N+ polycrystalline silicon layer 4 that becomes the first hetero semiconductor region.

Note that, though FIG. 13 shows the case where the P+ polycrystalline silicon layer 3 and the N+ polycrystalline silicon layer 4 are formed by the separate ion implantations in the case of the layer structure in the semiconductor device 200 of the first embodiment, which is shown in FIG. 1, the manufacturing method of this embodiment can also be applied, in completely the same way, to the case of forming the contact holes in the subsequent steps, which is shown in the semiconductor device 300 of FIG. 12 in the second embodiment.

In the configuration of the semiconductor device 400 as shown in FIG. 13, as described above, after the polycrystalline silicon layer is first deposited, the ions of the P+ and N+ impurities are separately implanted into only the desired positions of the semiconductor regions by resist patterning using the photolithography, thus making it possible to form the P+ polycrystalline silicon layer 3 and the N+ polycrystalline silicon layer 4. Accordingly, the polycrystalline silicon layers can be deposited at one time, and a manufacturing process of the semiconductor device can be simplified.

Fourth Embodiment

Figure 14:
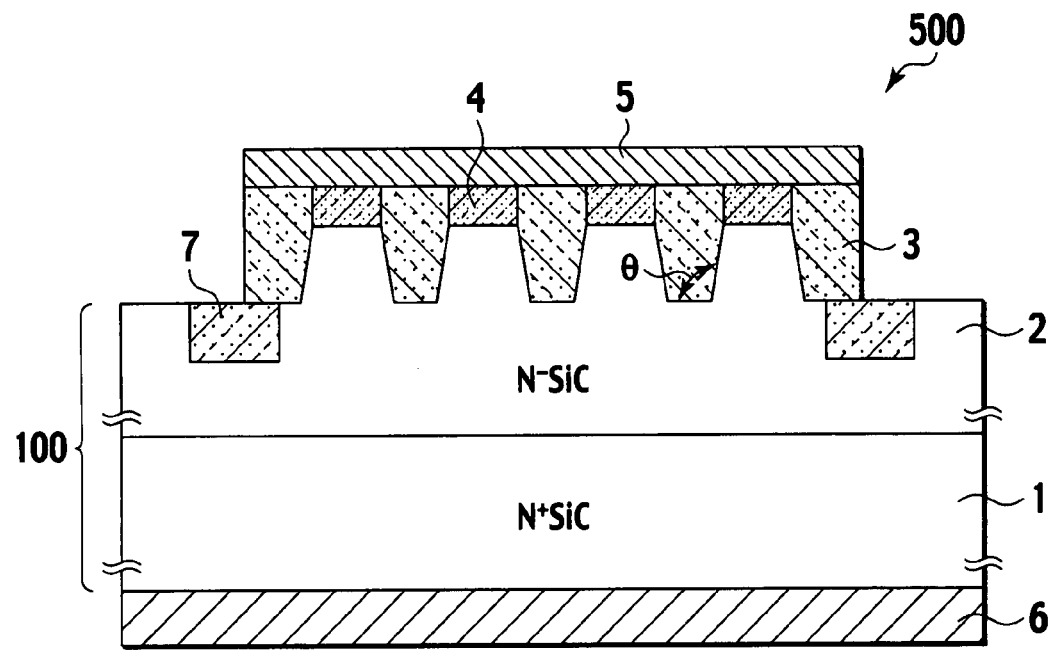
FIG. 14 is a cross-sectional view showing an element portion cross-sectional structure in a fourth embodiment of the semiconductor device according to the present invention.

Next, a description will be made of a fourth embodiment of the semiconductor device and the manufacturing method thereof according to the present invention. In each of the first to third embodiments, the case where an angle between the bottom surface of each of the trenches dug on the first main surface of the semiconductor base 100 and the side surface of each of the trenches is a right angle (90 degrees) in the portion in which the bottom surface of each of the trenches is in contact with the side surface thereof has been described. However, the semiconductor device and the manufacturing method thereof according to the present invention are not limited to such a case. As shown in FIG. 14, for example, the angle between the bottom surface and the side surface may be an obtuse angle (greater than 90 degrees). Furthermore, the angle may be any desired angle as long as it is equal to or greater than 90 degrees. Alternatively, as shown in FIG. 15, the portion in which the bottom surface of each of the trenches is in contact with the side surface thereof may be formed into a curved shape having an appropriate curvature radius.

Figure 15:
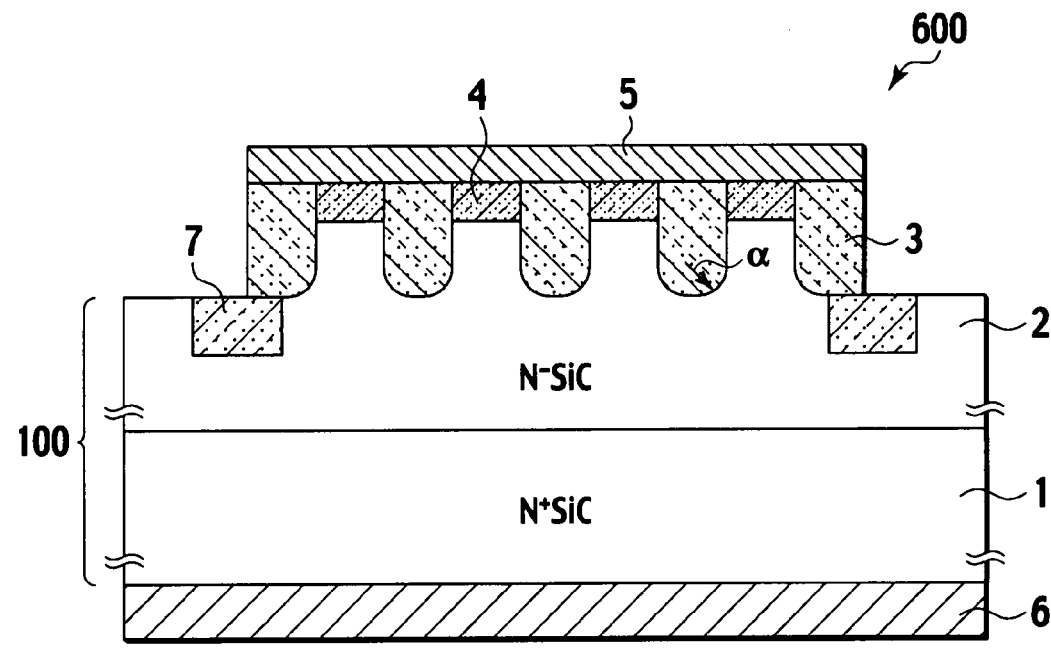
FIG. 15 is a cross-sectional view showing an element portion cross-sectional structure in a fourth embodiment of the semiconductor device according to the present invention.

Accordingly, the portion in which the P+ polycrystalline silicon layer 3 filled into the trenches is in contact with the N− silicon carbide epitaxial layer 2 is formed into an inclined shape having an obtuse angle as shown in FIG. 14 or into a curved shape as shown in FIG. 15. By doing so, it is possible to more safely avoid occurrence of a malfunction that a leakage current is generated from the portion in which the bottom surface of each trench is in contact with the side surface thereof and a desired breakdown voltage cannot be obtained when a reverse voltage is applied.

FIG. 14 is a cross-sectional view showing an example of an element portion cross-sectional structure in the third embodiment of the semiconductor device according to the present invention. FIG. 14 shows a case in which the angle between the bottom surface of each of the trenches dug on the first main surface of the semiconductor base 100 and the side surface thereof is the obtuse angle (greater than 90 degrees) in the portion in which the bottom surface of each of the trenches is in contact with the side surface thereof. Namely, in a semiconductor device 500 shown in FIG. 14, the portion in which the bottom surface of each of the trenches dug on the first main surface of the semiconductor base 100 is in contact with the side surface thereof is formed into the inclined shape at an angle θ of the obtuse angle (greater than 90 degrees).

FIG. 15 is a cross-sectional view showing another example of the element portion cross-sectional structure in the fourth embodiment of the semiconductor device according to the present invention. FIG. 15 shows a case in which the bottom surface of each of the trenches dug on the first main surface of the semiconductor base 100 is in contact with the side surface thereof is formed into the curved shape having an appropriate curvature-radius. Namely, in a semiconductor device 600 shown in FIG. 15, the portion in which the bottom surface of each trench dug on the first main surface of the semiconductor base 100 is in contact with the side surface thereof is formed into the curved shape at an appropriate curvature radius α. It is noted that the curvature radius α in the semiconductor device 600 shown in FIG. 15 may be any desired curvature radius as long as it is larger than a width by which electrons tunnel through the heterojunction interface formed by the N− silicon carbide epitaxial layer 2 constituting the semiconductor base 100 and the P+ polycrystalline silicon layer 3 constituting the second hetero semiconductor region different in conduction type from the semiconductor base 100.

In each of the semiconductor devices 500 and 600 in this embodiment shown in FIGS. 14 and 15, similarly to the first to third embodiments, silicon carbide (SiC) is used as a substrate material, and polycrystalline silicon is used as a material of a hetero semiconductor. Moreover, the insides of the trenches dug on the first main surface of the N− silicon carbide epitaxial layer 2 that forms the semiconductor base 100, which surface is opposite to the N+ silicon carbide substrate 1 side, are filled with the P+ polycrystalline silicon layer 3 as the second hetero semiconductor region of the conduction type different from that of the semiconductor base 100. The N+ polycrystalline silicon layer 4 is formed as the first hetero semiconductor region of the same conduction type as that of the semiconductor base 100 on the portions of the first main surface in which the trenches are not present. In the fourth embodiment, a case in which the trenches filled with the P+ polycrystalline silicon layer 3 differ in shape from those according to the first to third embodiments is shown.

Functions and effects of the semiconductor devices 500 and 600 including the trenches shaped as shown in FIGS. 14 and 15 will be described specifically with reference to energy band diagrams.

Figure 16:
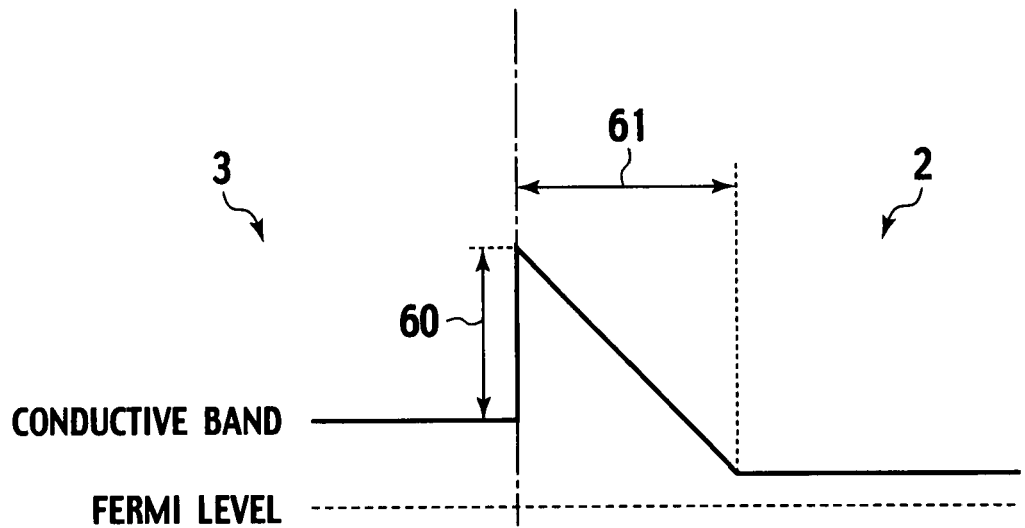
FIG. 16 is an energy band diagram showing an energy band state of each of the heterojunction interfaces formed between the P+ polycrystalline silicon layer and the N− silicon carbide epitaxial layer applied to the semiconductor device according to the present invention.
Figure 17:
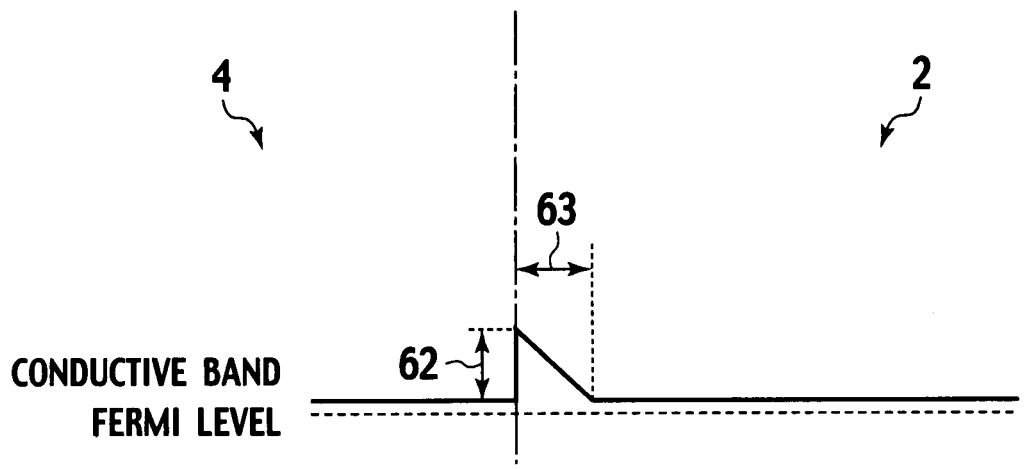
FIG. 17 is an energy band diagram showing an energy band state of each of the heterojunction interfaces formed between the N+ polycrystalline silicon layer and the N− silicon carbide epitaxial layer applied to the semiconductor device according to the present invention.

FIG. 16 is an energy band diagram showing an energy band state of each of the heterojunction interfaces formed between the P+ polycrystalline silicon layer 3 and the N− silicon carbide epitaxial layer 2 applied to the semiconductor device according to the present invention. FIG. 16 shows a general energy band state of the heterojunction interface formed between the P+ polycrystalline silicon layer 3 filled into the trenches and the N− silicon carbide epitaxial layer 2. FIG. 17 is an energy band diagram showing an energy band state of each of the heterojunction interfaces formed between the N+ polycrystalline silicon layer 4 and the N− silicon carbide epitaxial layer 2 applied to the semiconductor device according to the present invention. FIG. 17 shows a general energy band state of the heterojunction interface formed between the N+ polycrystalline silicon layer 4 and the N− silicon carbide epitaxial layer 2 on the first main surface of the N− silicon carbide epitaxial layer 2.

As shown in FIG. 16, a built-in voltage between the P+ polycrystalline silicon layer 3 and the N− silicon carbide epitaxial layer 2 that form the heterojunction interfaces of the different conduction type is high, and a height 60 of an energy barrier is large. Further, when the reverse voltage is applied, a width 61 of a built-in depletion layer formed in the N− silicon carbide epitaxial layer 2 is large, and the reverse breakdown voltage can be raised as stated above. On the other hand, as shown in FIG. 17, a built-in voltage between the N+ polycrystalline silicon layer 4 and the N− silicon carbide epitaxial layer 2 that form the heterojunction interfaces of the same conduction type is low, and a height 62 of an energy barrier is small. ON resistance when the forward voltage is applied can be suppressed to be low. However, when the reverse voltage is applied, a width 63 of a built-in depletion layer formed in the N− silicon carbide epitaxial layer 2 is small, so that the reverse breakdown voltage is low.

Figure 18:
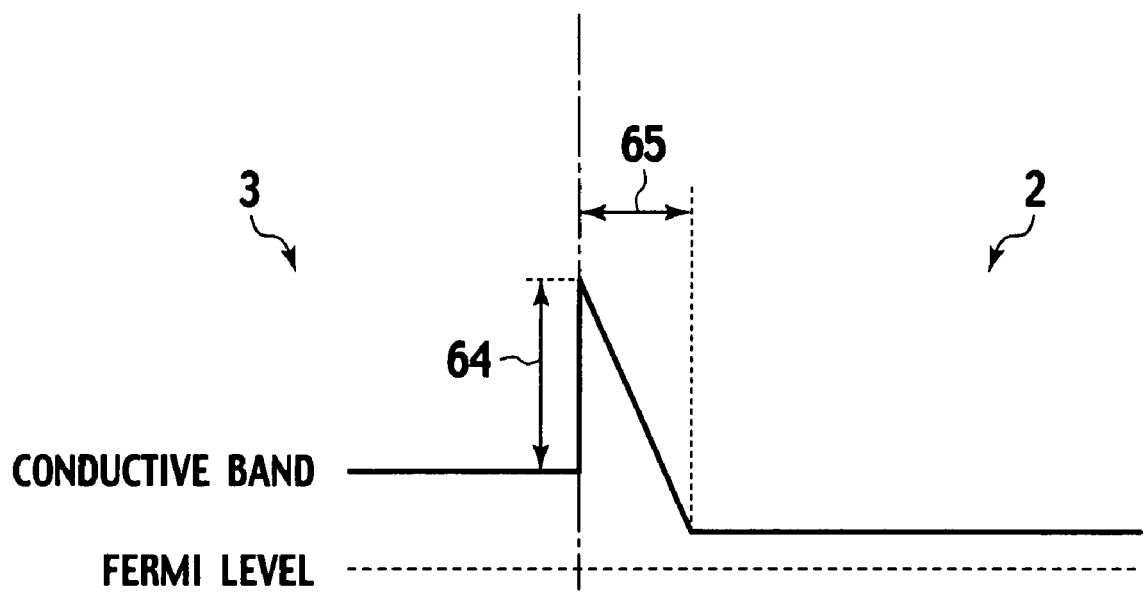
FIG. 18 is an energy band diagram showing an example of an energy band state of each of the heterojunction interfaces in the first to third embodiments of the semiconductor device according to the present invention.

FIG. 18 is an energy band diagram showing an example of an energy band state of each of the heterojunction interfaces in the first to third embodiments of the semiconductor device according to the present invention. FIG. 18 shows an example of the energy band state of the heterojunction interface in the portion in which the bottom surface of each of the trenches is in contact with the side surface thereof when the angle between the bottom surface of each trench and the side surface thereof is the right angle (90 degrees) as described in the first to third embodiments.

Namely, as shown in FIG. 18, if the angle between the bottom surface of each trench filled with the P+ polycrystalline silicon layer 3 and the side surface thereof is the right angle (90 degrees), a height 64 of an energy barrier formed by the heterojunction interface between the P+ polycrystalline silicon layer 3 and the N− silicon carbide epitaxial layer 2 can be kept almost equal to the height 60 of the energy barrier shown in FIG. 16 depending on the combination of the impurity concentration of the P+ polycrystalline silicon layer 3 and that of the N− silicon carbide epitaxial layer 2 in the portion in which the bottom surface of each trench is in contact with the side surface thereof. However, when the reverse voltage is applied, a width 65 of the built-in depletion layer formed in the N− silicon carbide epitaxial layer 2 is reduced, thereby possibly reducing the reverse breakdown voltage.

Considering these disadvantages, in the semiconductor device 500 shown in FIG. 15 or the semiconductor device 600 shown in FIG. 16, the structure having the inclined surface so that the angle θ between the bottom surface of each trench and the side surface thereof is at least 90 degrees or the structure having the curved surface so that the curvature radius α is larger than the width by which electrons tunnel through the heterojunction interface formed by the P+ polycrystalline silicon layer 3 and the N− silicon carbide epitaxial layer 2 in at least the portion in which the bottom surface of each trench is in contact with the side surface thereof is adopted as the structure of each trench. By doing so, it is possible to suppress the width of the built-in depletion layer from being reduced differently from the width 65 of the built-in depletion layer shown in FIG. 18 while the height of the energy barrier formed in the heterojunction interface between the P+ polycrystalline silicon layer 3 and the N− silicon carbide epitaxial layer 2 is kept to be equal to the height 64 of the energy barrier shown in FIG. 18. Hence, it is possible to further ensure preventing the phenomenon that a leakage current is generated from the portion in which the bottom surface of each trench is in contact with the side surface thereof and a desired breakdown voltage cannot be obtained when the reverse voltage is applied.

Description has been made of the embodiments to which the invention created by the inventors of the present invention is applied. However, the present invention is not limited to the descriptions and the drawings, which form a part of the disclosure of the present invention according to these embodiments. Specifically, all of other embodiments, examples, operational techniques and the like, which are made by those skilled in the art based on these embodiments, are naturally incorporated in the scope of the present invention. The above is additionally described at the end of this specification.

The entire content of Japanese Patent Application No. TOKUGAN 2006-124864 with a filing date of Apr. 28, 2006 is hereby incorporated by reference.

What is claimed is:

1. A semiconductor device including a semiconductor base of a predetermined conduction type, a hetero semiconductor region being in contact with a first main surface of the semiconductor base and formed of a semiconductor material different in band gap from the semiconductor base, a first electrode connected to the hetero semiconductor region, and a second electrode connected to the semiconductor base,
    wherein the hetero semiconductor region is composed of a first hetero semiconductor region of a same conduction type as the conduction type of the semiconductor base and a second hetero semiconductor region of a conduction type different from the conduction type of the semiconductor base, both of the first hetero semiconductor region and the second hetero semiconductor region are ohmically connected to the first electrode and form a heterojunction to the semiconductor base, the first hetero semiconductor region is formed on the first main surface of the semiconductor base, the first hetero semiconductor region forms a first heterojunction interface at the first main surface, and the second hetero semiconductor region is formed in trenches dug on the first main surface of the semiconductor base so as to form a second heterojunction interface to be deeper in the semiconductor base toward the second electrode than the first heterojunction interface.

2. The semiconductor device according to claim 1, wherein the conduction type of the semiconductor base is an N conduction type.

3. The semiconductor device according to claim 1, wherein the first hetero semiconductor region and the second hetero semiconductor region are in contact with each other.

4. The semiconductor device according to claim 1, wherein the second hetero semiconductor region formed in the trenches dug on the first main surface of the semiconductor base is in contact with the semiconductor base not only by a bottom surface of the second hetero semiconductor region but also by at least a part of side surfaces of the second hetero semiconductor region.

5. The semiconductor device according to claim 1, wherein the trenches dug on the first main surface of the semiconductor base are preset at one or a plurality of positions of the first main surface.

6. The semiconductor device according to claim 1, wherein an angle between a bottom surface of each of the trenches and a side surface of each of the trenches in a portion in which the bottom surface of each of the trenches contacts with the side surface of each of the trenches is at least 90 degrees.

7. The semiconductor device according to claim 1, wherein the portion in which the bottom surface of each of the trenches contacts with the side surface of each of the trenches is formed to have a curved surface at a larger curvature radius than at least a width by which electrons tunnel through an energy barrier on a heterojunction interface formed between the second hetero semiconductor region and the semiconductor base.

8. The semiconductor device according to claim 1, wherein the first electrode is formed so as to contact both of the first hetero semiconductor region and the second hetero semiconductor region, and is thereby ohmically connected to the first hetero semiconductor region and the second hetero semiconductor region.

9. The semiconductor device according to claim 1, wherein the first electrode is formed so as to contact the first hetero semiconductor region, and is thereby ohmically connected to the first hetero semiconductor region, and is ohmically connected to the second hetero semiconductor region through contact holes formed in the first hetero semiconductor region.

10. The semiconductor device according to claim 1, wherein both impurity densities of the first hetero semiconductor region and the second hetero semiconductor region are higher than an impurity density of the semiconductor base.

11. The semiconductor device according to claim 1, wherein field limiting regions configured to limit an electric field of the second electrode, are formed in at least a partial region of bottom portions of the trenches dug on the first main surface of the semiconductor base.

12. The semiconductor device according to claim 11, wherein the field limiting regions are formed of any of a semiconductor of a conduction type different from the conduction type of the semiconductor base, a high resistor, and an insulator.

13. The semiconductor device according to claim 1, wherein a material of the semiconductor base is made of any of silicon carbide, gallium nitride, and diamond.

14. The semiconductor device according to claim 1, wherein a material of the first hetero semiconductor region and/or the second hetero semiconductor region is made of any of monocrystalline silicon, polycrystalline silicon, amorphous silicon, monocrystalline silicon germanium, polycrystalline silicon germanium, and amorphous silicon germanium.

15. The semiconductor device according to claim 1, wherein a material of the first hetero semiconductor region and/or the second hetero semiconductor region is made of any of monocrystalline germanium, polycrystalline germanium, amorphous germanium, monocrystalline gallium arsenide, polycrystalline gallium arsenide, and amorphous gallium arsenide.

* * * * *